(12) United States Patent
Kienzle et al.

(10) Patent No.: US 7,015,487 B2
(45) Date of Patent: Mar. 21, 2006

(54) APPARATUS AND METHOD FOR EXPOSING A RADIATION SENSITIVE LAYER BY MEANS OF CHARGED PARTICLES AS WELL AS A MASK FOR THIS PURPOSE

(75) Inventors: Oliver Kienzle, Aalen (DE); Alexander Orchowski, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 207 days.

(21) Appl. No.: 09/934,262

(22) Filed: Aug. 21, 2001

(65) Prior Publication Data

US 2002/0071996 A1   Jun. 13, 2002

(30) Foreign Application Priority Data

Aug. 22, 2000   (DE)   ................................ 100 41 040

(51) Int. Cl.
*H01J 37/304*   (2006.01)
(52) U.S. Cl. ................................ 250/491.1; 250/492.22
(58) Field of Classification Search .......... 250/492.23, 250/492.22, 491.1; 430/5, 22, 30, 296
See application file for complete search history.

(56) References Cited

U.S. PATENT DOCUMENTS

| 4,521,711 A | 6/1985 | Okamoto et al. ....... 310/313 B |
| 4,736,172 A | 4/1988 | Ebneter ....................... 333/193 |
| 4,910,839 A | 3/1990 | Wright ....................... 29/25.35 |

(Continued)

FOREIGN PATENT DOCUMENTS

EP   0 953 876 A2   11/1999

(Continued)

OTHER PUBLICATIONS

J. A Liddle, et al.; "SCALPEL: A Projection Electron-Beam Approach To Sub-Optical Lithography"; 71 pages; Technology Review, Dec. 1999.

(Continued)

*Primary Examiner*—Kiet T. Nguyen
(74) *Attorney, Agent, or Firm*—Osha Liang LLP

(57) ABSTRACT

A projection apparatus for imaging a pattern of a mask onto a substrate by means of a beam of projected charged particles is disclosed. The apparatus includes a radiation sensitive layer. The apparatus also includes a mask. The mask includes a membrane layer made of a first material, scattering regions forming the pattern and made of a second material scattering the charged particles more than the membrane layer, and a plurality of straightly extending supporting struts spaced apart from one another and supporting the membrane layer together with the scattering regions. The apparatus also includes a projection apparatus. The projection apparatus includes a beam shaping device for producing the projection beam with a predetermined projection beam cross-section in the mask plane, and a positioning device for moving the projection beam cross-section in the mask plane along a predetermined path over the mask parallel to the direction into which the struts extend. The apparatus also includes a sensor for supplying a measuring signal which is dependent on the number of charged particles impinging on a mark region provided on the mask.

17 Claims, 9 Drawing Sheets

U.S. PATENT DOCUMENTS

| | | | | |
|---|---|---|---|---|
| 4,967,088 A | * | 10/1990 | Stengl et al. | 250/491.1 |
| 5,073,763 A | | 12/1991 | Wright | 333/193 |
| 5,079,112 A | | 1/1992 | Berger et al. | 430/4 |
| 5,130,213 A | | 7/1992 | Berger et al. | 430/4 |
| 5,162,689 A | | 11/1992 | Fliegel et al. | 310/313 B |
| 5,258,246 A | | 11/1993 | Berger et al. | 430/4 |
| 5,260,151 A | | 11/1993 | Berger et al. | 430/5 |
| 5,264,751 A | | 11/1993 | Dufilie et al. | 310/313 B |
| 5,287,036 A | | 2/1994 | Penunuri | 310/313 R |
| 5,316,879 A | | 5/1994 | Berger et al. | 430/5 |
| 5,327,039 A | | 7/1994 | Yamada | 310/313 B |
| 5,334,960 A | | 8/1994 | Penunuri | 313/193 |
| 5,353,206 A | | 10/1994 | Fejes | 333/195 |
| 5,376,505 A | | 12/1994 | Berger et al. | 430/296 |
| 5,406,159 A | | 4/1995 | Wright | 310/313 D |
| 5,646,584 A | | 7/1997 | Kondratyev et al. | 333/193 |
| 5,648,188 A | | 7/1997 | Doran | 430/22 |
| 5,650,629 A | | 7/1997 | Levi | 250/491.1 |
| 5,773,911 A | | 6/1998 | Tanaka et al. | 310/313 B |
| 5,906,902 A | | 5/1999 | Farrow | 430/30 |
| 5,973,826 A | | 10/1999 | Chapman et al. | 359/355 |
| 5,985,493 A | | 11/1999 | Liddle et al. | 430/5 |
| 6,033,079 A | | 3/2000 | Hudyma | 359/857 |
| 6,040,095 A | * | 3/2000 | Enichen et al. | 430/5 |
| 6,142,641 A | | 11/2000 | Cohen et al. | 359/859 |
| 6,147,574 A | | 11/2000 | Kidoh | 333/195 |
| 6,204,509 B1 | * | 3/2001 | Yahiro et al. | 250/491.1 |

FOREIGN PATENT DOCUMENTS

EP    0 969 326 A2    1/2000

OTHER PUBLICATIONS

ESRF Annual Report for 1995/1996 located at http:www.esrf.fr/info/science/annrep/95-96/report/exp/id32/id32.htm, 9 pgs.

Patent Abstracts of Japan, Publication No. 11142121, Publicate Date May 28, 1999, 1 page.

European Search Report date Dec. 16, 2003 (2 pages).

R.C. Farrow et al.; "Marks for Alignment and Registration in Projection Electron Lithography"; Journal of Vacuum Science & Technology B; vol. 11, No. 6, Nov./Dec. 1993; pp. 2175-2178.

* cited by examiner

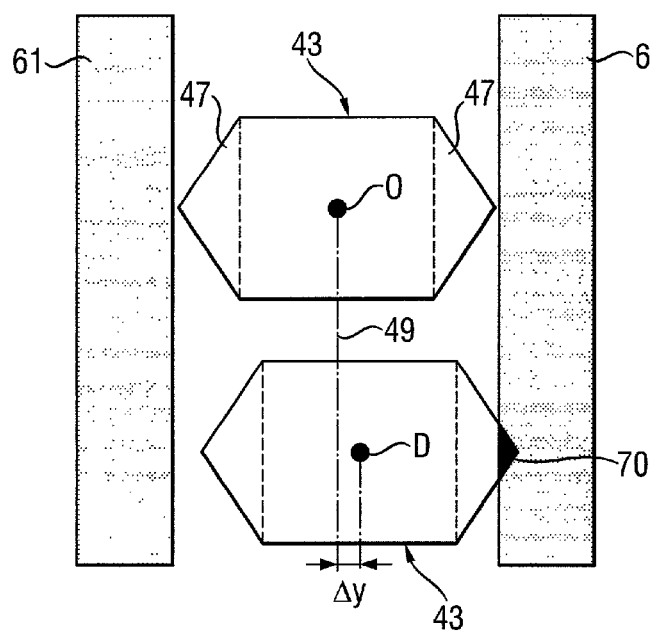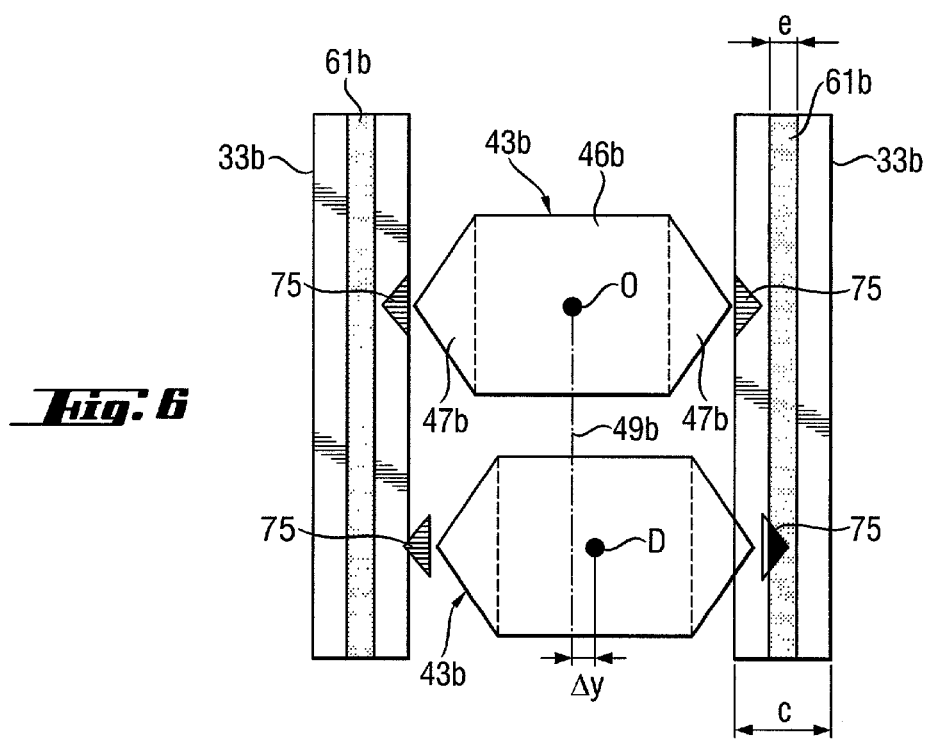

APPARATUS AND METHOD FOR EXPOSING A RADIATION SENSITIVE LAYER BY MEANS OF CHARGED PARTICLES AS WELL AS A MASK FOR THIS PURPOSE

CROSS-REFERENCE TO RELATED APPLICATIONS

This application claims priority from German Application Number 100-41040.5 filed on Aug. 22, 2000.

BACKGROUND OF INVENTION

1. Field of the Invention

The invention relates generally to device manufacturing by means of a lithographic method and in particular the exposure of radiation sensitive layers by means of charged particles, in particular by means of a beam of electrons.

2. Background Art

The devices manufactured by means of a lithographic method are primarily highly miniaturized devices, such as micro-mechanical structures or integrated circuits (ICs), for example. As far as integrated circuits are concerned, a mask, also referred to as a reticle, includes a circuit pattern which corresponds to one single layer of the circuit to be formed on a suitable substrate, for example, a silicon wafer. In order to image the pattern onto a target area, also referred to as a die, of the substrate, the substrate is first covered with a radiation sensitive layer, also referred to as a resist. Subsequently, the radiation sensitive layer is exposed or irradiated so that the pattern of the mask is imaged onto the radiation sensitive layer by means of charged particles. The radiation sensitive layer is then developed and either the irradiated or exposed regions or the non-irradiated or unexposed regions of the exposed layer are removed. The remaining structure of the radiation sensitive layer is then used as a mask, for example, in an etching step, an ion implantation step, a material deposition step or the like.

Charged particles, for example, electrons or ions, are used for this purpose to enable the formation of such small structures that cannot be produced or only with great difficulties by means of conventional photo-optical imaging process due to the diffraction limitation involved therewith.

The SCALPEL process (Scattering with Angular Limitation in Projection Electron-beam Lithography) is known as a process which employs a beam of electrons for exposing the radiation sensitive layer. This process is described in the article "SCALPEL: A Projection Electron-Beam Approach to Sub-Optical Lithography", Technology Review, December 1999, by J. A. Liddle, Lloyd R. Harriott, A. E. Novembre and W. K. Waskiewicz, Bell Laboratories, Lucent Technologies, 600 Mountain Avenue, Murray Hill, N.J. 07974, USA. The disclosure of said document is incorporated herein by reference in its entirety. Furthermore, U.S. Pat. Nos. 5,079,112; 5,130,213; 5,260,151; 5,376,505; 5,258,246; 5,316,879; as well as European Patent Application Numbers 0,953,876 A2 and 0,969,326 A2 relate to the SCALPEL process. The disclosures of the above-mentioned patents and patent applications are incorporated herein by reference in their entirety.

The SCALPEL process is described below with reference to Prior Art FIG. 1.

FIG. 1 schematically shows a mask 1 suitable for the exposure of a radiation sensitive layer on a substrate 3 by means of an electron beam. The mask includes supporting struts 7 to which a membrane layer 5 is attached which is relatively transparent for the electrons. The pattern to be imaged onto the substrate 3 is formed by scattering regions 9 provided on the relatively transparent membrane layer. Electron beams 11 and 12 passing only through the membrane layer 5 and not through the scattering regions 9 pass through the mask 1 substantially unscattered and substantially straight or at relatively small scattering angles, whereas electron beams 13 which pass through the membrane layer 5 and the scattering regions 9 are deflected from their original direction by a larger scattering angle in the scattering regions 9. The electron beams 11, 12, 13 pass through an electromagnetic or/and electrostatic projection lens system 15 and are deflected by the same such that the unscattered electron beams 11, 12 pass through an aperture formed in an aperture filter 17, whereas the electrons 13 scattered through larger scattering angles are blocked by the aperture filter 17. After having passed through the aperture filter 17, the electron beams 11, 12 which have been scattered through smaller scattering angles pass through a further projection lens system 19 which focuses the beams 11, 12 for imaging the pattern 9 onto the substrate 3.

The electron field impinging on the mask 1 also comprises beams 21 which do not pass through the spaces between the struts 7, as is the case with the above-described beams 11, 12, 13, but impinge on the struts 7. Due to the thickness of the struts 7, the beams 21 are more likely to be scattered than the beams 11 and 12 which merely pass through the membrane layer 5. Therefore, the regions of the mask which are positioned in its projection along the electron field below the struts are not used to form the pattern. Accordingly, beams 21 which pass through the struts 7 and the membrane layer unscattered shall not pass through the aperture filter 17 onto the substrate 3 either.

For this purpose, European Patent Application Number 0,969,326 A2 proposes a spatially limited electron beam, the cross-section of which in the mask plane is limited such that it passes through the mask at spaces between adjacent struts and does not strike the struts as such. Such spatially limited beam is then moved relative to the mask in the direction into which the struts extend in order to scan all regions of the mask used to form the pattern. In order to spatially define the beam cross-section, European Patent Application Number 0,969,326 A2 proposes, for example, to use aperture filters. This enables the beam to form such that its cross-section corresponds exactly to the inside width between adjacent struts, and scattering of the electrons at the struts is thus preventable, provided that the beam itself is positioned with sufficient accuracy relative to the mask and the scanning motion of the beam relative to the mask is likewise performed with sufficient accuracy so that the field of beams does not strike the struts. Moreover, the regions between the struts of the mask are imaged onto adjacent strips on the substrate to be exposed. Positional inaccuracies in scanning the mask may then result into underexposures or double exposures on the substrate.

SUMMARY OF INVENTION

A projection apparatus for imaging a pattern of a mask onto a substrate by means of a beam of projected charged particles is disclosed. The apparatus includes a radiation sensitive layer. The apparatus also includes a mask. The mask includes a membrane layer made of a first material, scattering regions forming the pattern and made of a second material scattering the charged particles more than the membrane layer, and a plurality of straightly extending supporting struts spaced apart from one another and supporting the membrane layer together with the scattering regions. The apparatus also includes a projection apparatus. The projection apparatus includes a beam shaping device for producing the projection beam with a predetermined projection beam cross-section in the mask plane, and a positioning device for moving the projection beam cross-section in the mask plane along a predetermined path over the mask parallel to the direction into which the struts extend. The apparatus also includes a sensor for supplying a measuring signal which is dependent on the number of charged particles impinging on a mark region provided on the mask.

Other aspects and advantages of the invention will be apparent from the following description and the appended claims.

BRIEF DESCRIPTION OF DRAWINGS

FIG. 5 shows the position of a projection beam cross-section used in the projection beam apparatus according to FIG. 4 relative to the mark regions;

FIG. 6 shows another embodiment of the invention with an auxiliary positioning beam;

DETAILED DESCRIPTION

Figure 1:
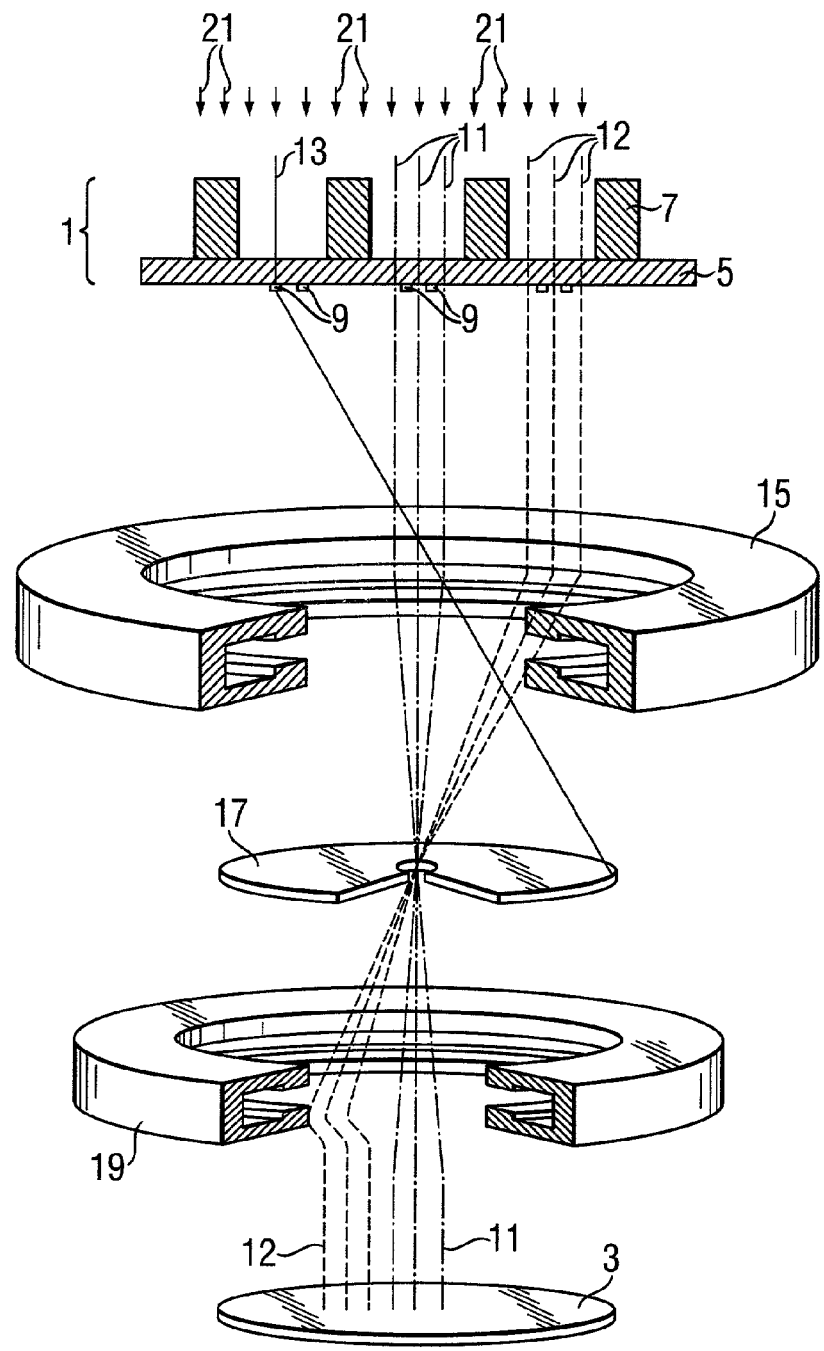
FIG. 1 shows a projection apparatus according to the prior art.

In a first embodiment of the invention, there is provided a mask including a membrane layer made of a first material, scattering regions forming the pattern and made of a second material scattering the charged particles stronger than the membrane layer and a plurality of straightly extending supporting struts spaced apart from one another and supporting the membrane layer together with the scattering regions.

In another embodiment, the invention proceeds from a projection apparatus for imaging the pattern of the mask onto a substrate comprising a radiation sensitive layer by means of a beam of charged particles, said projection apparatus including a beam shaping means for producing the projection beam with a predetermined projection beam cross-section in the mask plane as well as a positioning device for moving the projection beam cross-section in the mask plane over the mask along a predetermined path parallel to a direction into which the struts extend.

One possible explanation for the invention is based on the idea to provide specific mark regions on the mask that are formed by a material which differs from the material of the membrane layer and the pattern-forming material in respect of its interaction with the charged particles. Said different interaction with the charged particles which is characteristic of the mark material is detectable by a suitable sensor so that the sensor provides a measuring signal that is dependent on the number of charged particles which impinge on the mark region. If the mark regions are provided at suitable locations on the mask, the measuring signal can be used to determine the position of the projection beam cross-section in the mask plane and to provide a "guidance" for the movement of the projection beam cross-section relative to the mask.

The interaction which is characteristic of the mark material and which distinguishes said material from the material of the membrane layer and the material of the scattering regions may reside in another or different scattering effect, reflection effect or absorption effect for the charged particles, or the distinguishing interaction may also reside in another or different emission effect for secondary particles, such as X-ray emission or Auger electron emission. What is essential is merely that this distinguishing interaction is detectable by a suitable measuring method so that any suitable and detectable physical effect comes into consideration for this purpose. In one embodiment, this characteristic interaction is detectable by means of an Auger electron detector, a backscattering electron detector, an X-ray detector or a fluorescence radiation detector. Such a detector may be positioned on the side of the mask facing towards the beam shaping means, but also on the side of the mask facing away from the beam shaping means.

In another embodiment, the mark region is formed by a layer of mark material which is applied on the end face of the strut facing away from the membrane layer. Such a configuration is particularly advantageous if the struts are provided on the side of the mask facing towards the beam shaping means.

In another embodiment, there is disclosed a configuration in which the struts are formed of a substrate by means of an etching process, with a mask representing the geometry of the struts having been applied on the substrate before the etching step. If a suitable mask material is selected, the latter may remain on the struts after the struts have been etched out to still serve as mark material.

Alternatively, the mark region may also be formed by a mark layer positioned between the membrane layer and the strut. In another embodiment, the struts are formed by means of an etching process wherein an etch stop layer is positioned between the membrane layer and the material from which the struts are to be etched away. After the etching step this etch stop layer is removed from the space between the struts in order for the struts to be formed, but remains between the struts and the membrane layer. If a suitable material is selected for the etch stop layer, those regions of the etch stop layer which remain between the struts and the membrane layer may then be subsequently used as mark regions.

Alternatively, the mark regions may, however, also be formed on the side of the membrane layer facing away from the struts. This configuration may be suitable if the struts themselves are provided on the side of the mask facing away from the beam shaping means.

One way to enable the beam guidance is obtained if the strut itself forms the mark region.

According to a first further aspect of the invention, the positioning device is responsive to the measuring signal in order to reduce deviations from the predetermined path. It is then possible to guide the projection beam cross-section over the mask such that no or only few charged particles of the projection beam undesirably impinge on the struts, if possible.

In another embodiment, the projection beam cross-section has a width in the direction transverse to the direction into which the struts extend which corresponds substantially to the inside width between adjacent struts. If, in this case, the mark region is positioned such that, viewed in beam direction, the mark region coincides with the struts, the sensor will detect substantially no interaction of the charged particles with the mark region if the projection beam cross-section is positioned on the predetermined path relative to the mask. As soon as the beam deviates from its predetermined path, the projection beam cross-section will contact the mark region and produce the interaction with the mark material which is characteristic thereto and which is detectable by the sensor. The positioning device is then able to correct the path of the beam correspondingly in order for the latter to resume its predetermined path.

In another embodiment, two different kinds of mark regions are provided which are formed of different mark materials which interact with the charged particles in a manner which is distinguishable by the sensor. If the one kind of mark region is formed on a strut, viewed in projection in beam direction, and the other kind of mark region is formed on the strut adjacent thereto, viewed in projection, it can be distinguished, when a beam moves between said two struts, whether the path of the beam deviates from the predetermined path in the direction to the one strut or in the direction to the other strut, so that the positioning device is better able to perform a corresponding correction.

In another embodiment, the beam shaping means produces, besides the projection beam, at least one auxiliary positioning beam which is provided to interact with the mark region. If the projection beam cross-section is accurately positioned between adjacent struts, the auxiliary beam cross-section is then positioned relative to the projection beam cross-section such that it impinges on a strut. The mark region is then positioned, viewed in projection in beam direction, on the struts so that, with correctly positioned projection beam, the interaction with the mark material does not occur through the projection beam itself but through the auxiliary beam. The position of the projection beam can thus be detected even if it does not deviate from its predetermined path. On the other hand, the auxiliary beam impinges on a region of the mask that is not used for imaging the pattern onto the substrate. The charged particles of the auxiliary beam are scattered from this area by the strut or/and the mark region provided in the projection thereof and, therefore, do substantially not contribute either or only little to the exposure of the radiation sensitive layer.

The auxiliary positioning beam may be configured such that, viewed in a direction transverse to the direction into which the predetermined path extends, it continuously tapers. As a result, an increasing portion of the auxiliary positioning beam impinges on the mark region as the deviation of the path of the projection beam cross-section from its predetermined path increases so that the strength of the measuring signal increases or decreases with increasing deviation of the path from the predetermined path. As a result, the measuring signal is particularly well suited for the correction of the path by means of the positioning device.

In another embodiment, the beam shaping means produces two auxiliary positioning beams, whose distance in the mask plane is such that, with accurately positioned projection beam, the two auxiliary beams impinge each on different struts, but not on the area between the struts.

In this respect, it may be useful for the mark region, viewed in beam direction, to be positioned within the projected area of the strut and at a predetermined distance from the edges thereof. The actual position of the projection beam can then be detected particularly precisely, especially in conjunction with the tapering auxiliary beam cross-section.

Alternatively, it is also possible for the mark region to be positioned between adjacent struts and close to one of the two adjacent struts. However, the mark region should then only insignificantly reduce the number of charged particles passing unscattered through the mask. Together with a projection beam cross-section which tapers in an area close to the struts towards the struts, a detection of the position of the projection beam is also possible with the mark region that is positioned between the struts.

In another embodiment, a masking region is provided which, viewed in projection parallel to the particle beam, overlaps at least partially with the mark region. It is the purpose of the masking region to scatter charged particles which have been slightly scattered by the mark region to such an extent that they are not imaged onto the radiation sensitive layer. Accordingly, charged particles which are not scattered or scattered only through a small scatter angle by the interaction with the mark region are scattered as a result of the interaction with the masking region through such a large scatter angle that they are not imaged onto the layer to be exposed in such a way as it is the case with the charged particles which merely pass through the membrane layer. To this end, the masking region is preferably formed of a material which scatters the charged particles stronger than the membrane layer or/and the mark material or/and the supporting strut.

In another embodiment, the material of the masking region comprises the material of the scattering region. In particular, the masking region and the scattering regions can be formed in a common fabrication step of the mask.

Figure 2:
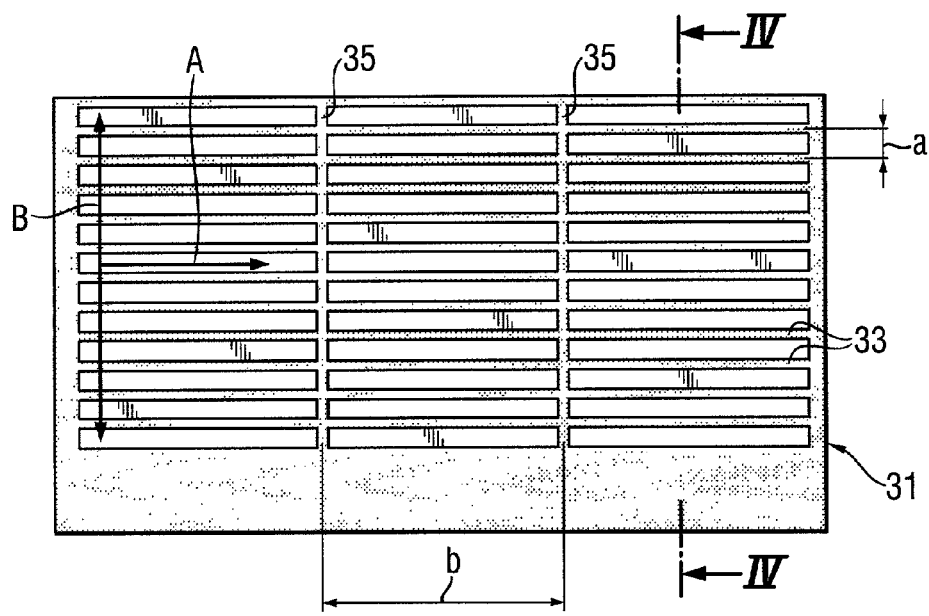
FIG. 2 is a top view of one embodiment of a mask according to the invention which also illustrates beam guidance directions.
Figure 4:
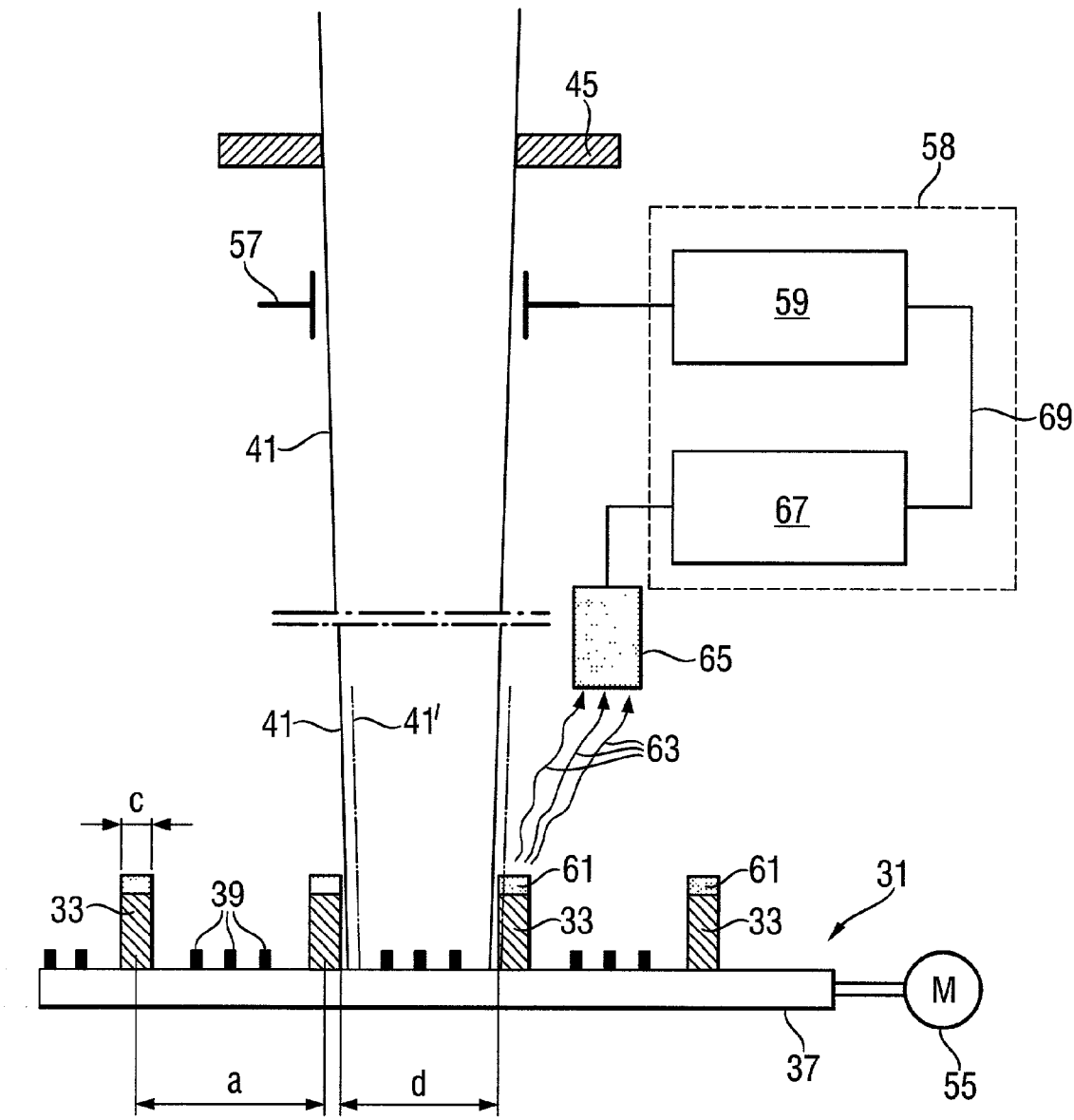
FIG. 4 shows a projection apparatus according to another embodiment of the invention.

One of embodiment of the structure of the mask 31 according to the invention is apparent from FIGS. 2 and 4, FIG. 2 showing a top view of the mask and FIG. 4 showing a cross-section of the mask 31 along line IV—IV of FIG. 2.

As seen in FIG. 2, the mask 31 comprises a planar uniform and rectangular structure of longitudinal struts 33 as well as struts 35 extending transversely thereto. The struts 33 are spaced apart from one another by a uniform distance a of, for example, 1.1 mm to 1.5 mm. The struts 35 are spaced from one another by a distance b which is larger than the distance a at which the struts 33 are spaced apart from one another.

As seen in FIG. 4, the structure of struts 33, 35 supports a membrane layer 37 which scatters electrons relatively little. The pattern of the mask 31 is formed by scattering regions 39 positioned between the struts 33, 35 on the membrane layer 37.

Figure 3:
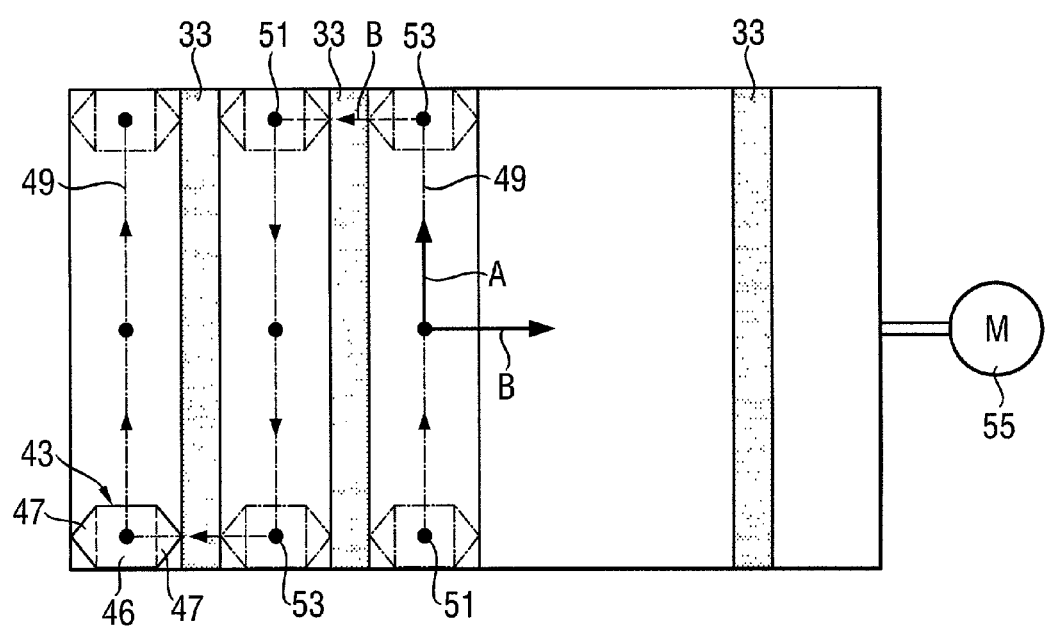
FIG. 3 is an enlarged view of FIG. 2 to illustrate the guidance of a projection beam cross-section along a predetermined path.

As can be seen in FIG. 4, an electron beam 41 generated by an electron beam source (not shown) and having an energy of, for example, 100 keV is directed onto the mask 31, the cross-section of said beam 43 (see FIG. 3) being determined in the level of the mask 31 by a beam shaping means 45. The beam shaping means 45 may, for example, be constituted by an aperture filter. As is evident from FIG. 3, the projection beam cross-section 43 has the shape of a polygon and comprises a central rectangular area 46 and two adjacent triangular areas 47 at opposite sides of the rectangle 46.

A positioning device moves the beam cross-section 43 between adjacent struts 33 in a direction A (FIG. 2) straightly along predetermined paths 49. Such a predetermined path 49 starts at a point 51 and terminates at a point 53 such that the projection beam cross-section 43 passes over the entire area between adjacent struts 33. As soon as the projection beam cross-section has reached point 53, the projection beam is switched off by the electron beam source and the projection beam cross-section jumps over a strut 33 in a direction B which extends into a direction transverse to the direction into which the struts 33 extend. It then reaches a new starting point 51 between the next adjacent pair of struts 33 and is then again uniformly moved to a further end point 53. In this way, by and by all areas of the membrane layer 37 between the struts 33, 35 are scanned by the beam cross-section 43.

The positioning device comprises an electron-optical apparatus which causes the beam to be deflected in direction A, as well as a drive 55 which uniformly moves the mask relative to the electron-optical system in direction B. Moreover, the positioning device comprises a further electron-optical component 57 which likewise deflects the projection beam 41 in direction B such that the projection beam cross-section 43 moves along the predetermined paths 49 between the struts 33 and relative to the electron-optical system during the continuous movement of the mask 31 controlled by the motor 55.

Further details regarding the configuration of the projection beam cross-section and the mask 31 as well as the structure of the struts 33, 35 thereof are evident from the above-mentioned article by Liddle et al. The positioning device further comprises a control means 58 which includes a deflection signal generator 59 for driving the electron-optical component 57 to deflect the projection beam 41 in the directions A and B.

In the present embodiment the tips of both triangular areas 47 of the projection beam cross-section 43 are spaced apart from one another in the mask plane by a distance which corresponds to the inside width d between the struts 33 which are spaced apart from one another by the distance a. If the projection beam cross-section is accurately positioned on the predetermined path 49 (see FIG. 5) with a beam center O, no electrons of the projection beam 41 impinge on the struts 33, as is illustrated in FIG. 4 by the beam 41 in continuous line and in FIG. 5 by the upper beam cross-section. If the projection beam cross-section deviates from its predetermined path 49 by a distance y, the electrons of one of the triangular areas 47 impinge on a strut 33, as it is shown in FIG. 4 by a beam 41' represented by a dashed line and in FIG. 5 by the lower beam cross-section with beam center D.

In order for this deviation from the predetermined path 49 to be detected, a mark layer 61 is formed on the end faces of each of the struts 33 facing away from the membrane layer 37. This mark layer 61 is formed of a material which differs from the materials used for the membrane layer 37, the scattering regions 39 and the struts 33 and produces a characteristic X-ray radiation 63 upon interaction with the electrons of the projection beam. This X-ray radiation 63 is detected by an X-ray detector 65. The output of the X-ray detector 65 is connected to an energy analyzer 67 provided in the control means 58 to filter the output signal of the detector 65 in order for the characteristic X-ray radiation 63 to be discriminated from other radiation components that might be detected by the detector 65. The signal supplied by the energy analyzer may be substantially proportional to the number of the electrons of the projection beam 41 impinging on the struts 33 or the mark regions 61 and thus also may be approximately proportional to the area of overlap between the beam cross-section 43 and the mark region 61 designated in FIG. 5 by reference number 70. This signal is supplied to the deflection generator 59 as measuring signal 69. The deflection signal generator evaluates the measuring signal 69 and drives the electron-optical component 57 such that the signal 69 is minimized in order for the projection beam cross-section 43 to be positioned on the predetermined path 49.

The mask 31 may be fabricated by means of an etching process as it is described in European Patent Application 0,953,876 A2 for a conventional mask. A substrate made of the material of the struts 33, 35 is coated on one side with the material of the membrane layer 37 and on the other side with a mask material. The mask material is formed as a grid which corresponds to the geometry of the struts 33, 35. The substrate material in the grid spaces is removed in an etching step such that the substrate material that remains below the grid mask forms the struts 33, 35. If a suitable material is selected for the grid mask, it may remain on the struts to form the scattering regions 61. However, the material of the grid mask may also be removed and the struts 33 are then coated on their end faces facing away from the membrane layer 33 with the mark regions 61.

The following materials may, for example, be employed to form the mask 31: silicon for the struts 33, 35; silicon, silicon nitride, silicon carbide and diamond for the membrane layer 37; titanium, chromium, aluminium and tungsten as well as the oxides and alloys thereof for the scattering regions 39. As material for the mark regions 61 iridium, platinum, gold and lead and the oxides thereof may be used as heavy elements, which materials are distinguishable in particular in respect of their X-ray spectrum from the materials used for the scattering regions 39, and germanium and compositions thereof may be used as medium heavy elements. In another embodiment, light materials may be used for the mark regions 61, because typically they do not scatter electrons as strongly. In this respect, those elements which are compatible with the fabrication of the product for which the exposure with the charged particles is employed may be used. In silicon-based semiconductor fabrication, germanium may be used as a material for the mark regions 61. In another embodiment, materials are used for the mark regions 61 which are caused to scintillate by the irradiation with charged particles. Such materials are known, for example, for the coating of viewing screens of transmission electron microscopes, such as phosphorous, for example. Further materials which may be used for the mark regions are likewise aluminium, titanium, vanadium and germanium which may be advantageous in respect of a detector identification through Auger electrons. Other materials and material combinations are of course also conceivable for the fabrication of the mask components.

Variants of the above-described embodiments of the invention are described below in further detail. For the purpose of distinction, components which correspond to one another in structure and function are designated by the reference numbers used in FIGS. 2, 3, 4 and 5, however, they are each supplemented by an additional letter. For the purpose of explanation, reference is made in each case to the above description in its entirety.

Figure 7:
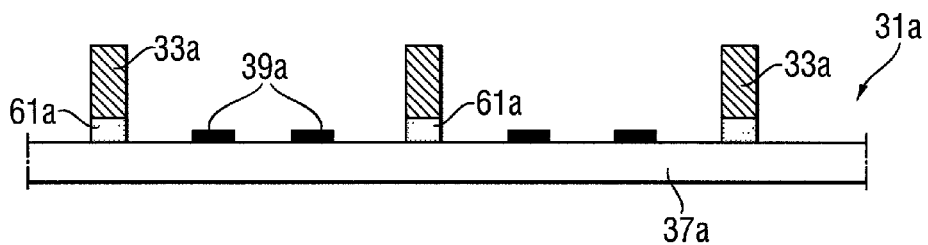
FIG. 7 shows another embodiment of the mask shown in FIG. 4.

FIG. 7 shows a variant of the mask shown in FIG. 4. The mask 31a shown in FIG. 7 differs from the mask shown in FIG. 4 in that mark regions 61a are positioned between struts 33a and a membrane layer 37a. The mask 31a can be fabricated by modifying the manufacturing process described above for the mask of FIG. 4. Prior to the application of the membrane layer onto the substrate of strut material, the process may involve the application of an etch stop layer on said substrate. This serves to prevent the membrane layer from being damaged by the etching process which is employed to etch the struts 33a out of the substrate. After the struts 33a have been etched out, the etch stop layer is removed in a separate step so that the membrane layer 37a lies uncovered between the struts 33a. Below the struts 33a and the membrane layer 37a, however, the material of the etch stop layer is protected by the struts 33a and thus remains intact. If the etch stop layer material is appropriately selected, this remaining material can serve as material for the mark regions, provided that it differs from the materials of the membrane layer 37a, the struts 33a and the scattering regions 39a in respect of its interaction with the electrons.

The embodiment of the invention shown in FIG. 6 again comprises a projection beam cross-section 43b formed of a rectangular central portion 46b and two triangular portions 47b positioned on opposite sides of the central portion 46b. The distance of the tips of the triangular portions 47b is again selected such that it corresponds to the inside width between adjacent struts 33b. With the upper projection beam cross-section 43b shown in FIG. 6 which has its beam center at point O on the predetermined path 49b thus no electrons of the projection beam cross-section 43b impinge on the struts 33b.

The electron beam of FIG. 6, however, comprises two auxiliary positioning beams 75, one being positioned on each side of the projection beam 43b and outside thereof. The auxiliary positioning beams 75 can, for example, be formed together with the projection beam 43b by the aperture filter 45 which is schematically shown in FIG. 4. Theses auxiliary beams 75 interact with mark regions 61b which are each positioned centrally on the struts 33b and have a width e of, for example, 200 μm which is smaller than the width c of the struts 33. If the beam center of the projection beam cross-section 43b is positioned at point O on the predetermined path, the auxiliary beams 75 impinge on the area of the end faces of the struts 33b which are not covered by the mark region 61b.

However, if the projection beam cross-section deviates from the predetermined path by a distance Δy, as is shown in FIG. 6 for the lower projection beam cross-section 43b with beam center D, the right auxiliary beam 75 of FIG. 6 impinges on the mark region 61b. This causes the electrons of the auxiliary beam 75 to interact with the material of the mark region 61b, which interaction is detectable by a sensor shown in FIG. 4 to correct the position of the projection beam cross-section by means of an electron-optical system. This correction is effected in such a manner that the measuring signal of the sensor is minimized, i.e., such that no electrons of the auxiliary beams 75 strike the mark regions 61b.

Figure 8:
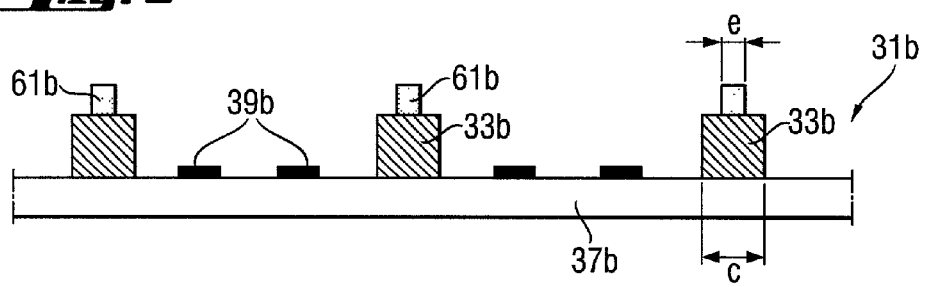
FIG. 8 shows another embodiment of the mask for use with the auxiliary positioning beam according to FIG. 6.

A mask 31b which may be used for the embodiment of FIG. 6 is shown in FIG. 8 in cross-section. The mask 31b of FIG. 8 is similar to that shown in FIG. 4, except one difference is that the mark regions 61b do not cover the entire end face of the struts 33b. The mask 31b can be fabricated in a process which is similar to the manufacturing process of the mask of FIG. 4, except that the material used to form the mark region 61b is removed, for example, in a further etching step such that the mark regions 61b remain with their width e.

Figure 9:
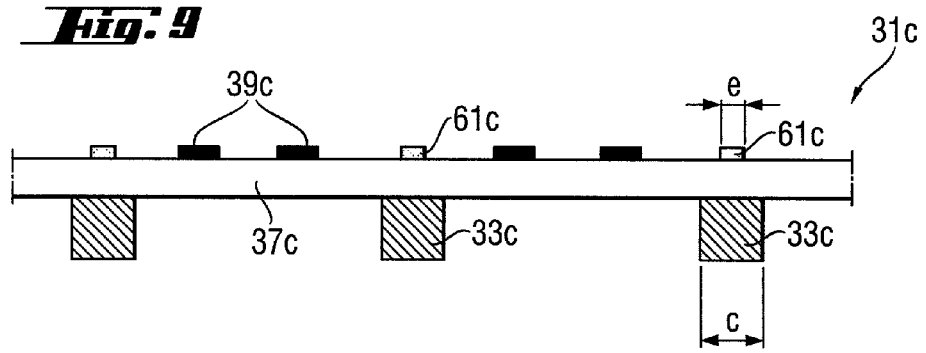
FIG. 9 shows another embodiment of the mask for use with the auxiliary positioning beam according to FIG. 6.

FIG. 9 shows a further embodiment of a mask 31c, with mark regions 61c, having a width e which is smaller than a width c of the struts 33c. This mask can likewise be fabricated in a process which is employed to produce the masks shown in FIG. 4, except that the mark regions 61c are deposited on the membrane layer 37c in an additional step.

Figure 10:
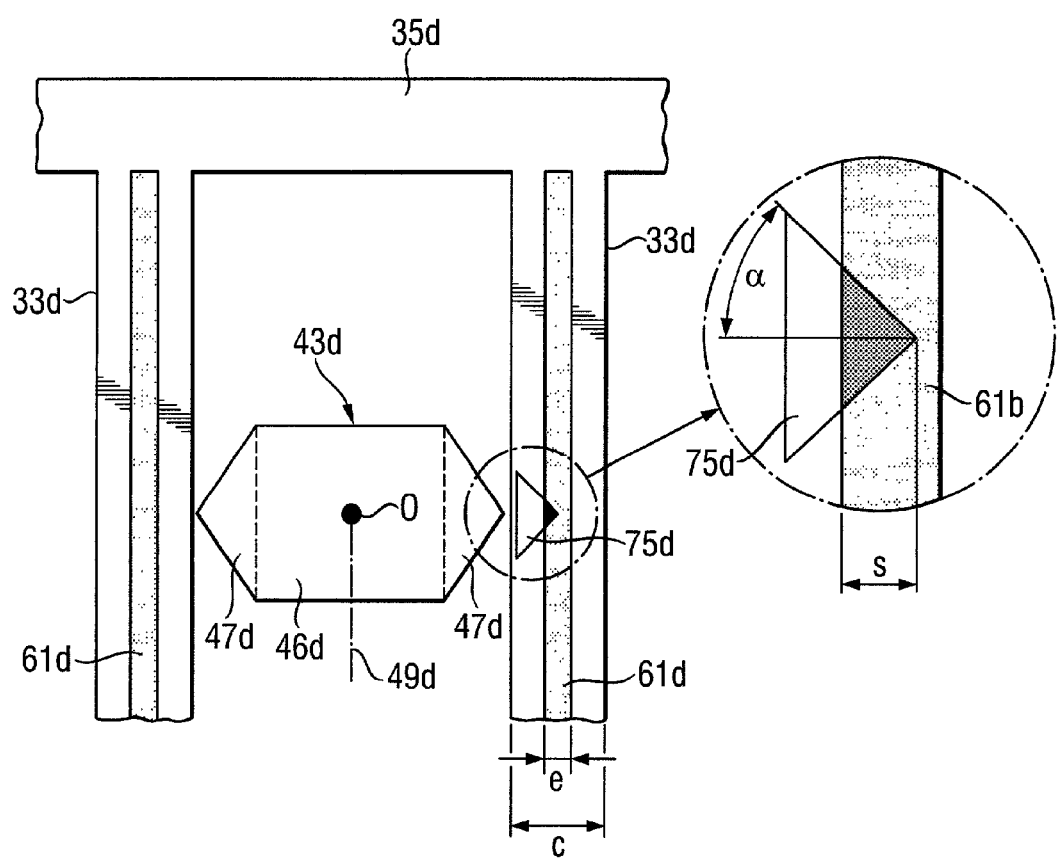
FIG. 10 shows another embodiment of the invention with auxiliary positioning beam.

FIG. 10 shows a variant of the embodiment shown in FIG. 6. Here, a projection beam cross section 43d is configured such that tips of triangles 47d do not contact the struts 33d of the mask if the beam center O is accurately positioned on a predetermined path 49d. Also, mark regions 61d are provided which, viewed in projection in beam direction, cover with their width e only a part of the width c of the struts 33d.

An auxiliary positioning beam is positioned with its auxiliary beam cross-section 75d in the mask plane relative to the projection beam cross-section 43d such that, when the projection beam cross-section 43d is accurately positioned, a portion of the auxiliary beam 75d impinges on the mark region 61d. This causes electrons of the auxiliary beam 75d to interact with the material of the mark region 61d, which interaction is detected by the sensor and is supplied to the deviation signal generator as reference measuring signal via the energy analyzer.

The auxiliary beam cross-section 75d is of triangular shape such that its cross-section 75d tapers in a direction transversely to the direction into which the struts 33d extend. Accordingly, if the projection beam center deviates from point O, the area with which the auxiliary beam 75d impinges on the mark region 61d changes, as is illustrated by the enlarged view integrated in FIG. 10: the number of interactions is proportional to the area with which the auxiliary beam cross-section 75d overlaps with the mark region 61b, said area F being $F=s^2 \times \tan \alpha$, wherein the aperture angle of the triangular shape of the auxiliary beam 75d being 2 α.

The deviation generator evaluates the resulting measuring signal and drives the electron-optical component (reference number 57 in FIG. 4) such that the measuring signal is held at a predetermined value in order to position the projection beam cross-section 73d on the predetermined path 49d.

Figure 11:
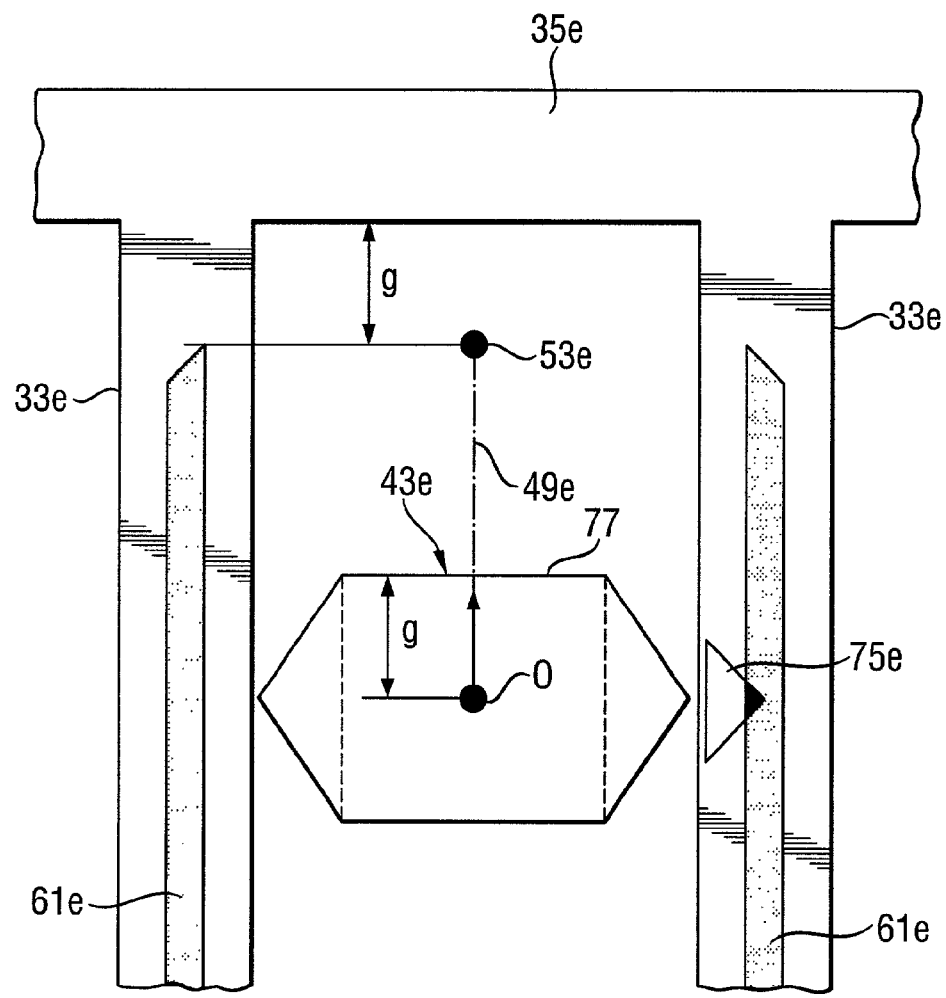
FIG. 11 shows an embodiment of the invention for detecting a path end.

FIG. 11 shows another embodiment of the invention. It is similar to the embodiment shown in FIG. 10, except that one is difference is that a mark region 61e is used together with an auxiliary positioning beam 75e not just to position the beam center O of the projection beam cross-section 43e on a predetermined path 49e. The auxiliary beam 75e and the mark region 61e are also used to determine the arrival at the end point 53e (see FIG. 3) when the projection beam 43e moves along the predetermined path 49e.

The end point 53e is positioned at a distance g from a transverse strut 35e which corresponds to the distance of the beam center O from a front side 77 of the projection beam cross-section 43e.

The mark region 61e extends along the strut 33e in a direction towards the transverse strut 35e, but ends at a distance in front of the strut 35e which likewise corresponds to the distance g such that, when the projection beam center O is positioned on the end point 53e, there is no overlap between the auxiliary beam 75e and the mark region 61e. Accordingly, the number of interactions between the electrons of the auxiliary beam 75e and the mark region 61e is reduced to zero, which is detectable by the sensor and, among other possible uses, can be used as a signal to switch off the projection beam at an end point 53e of its predetermined path 49e.

Figure 12:
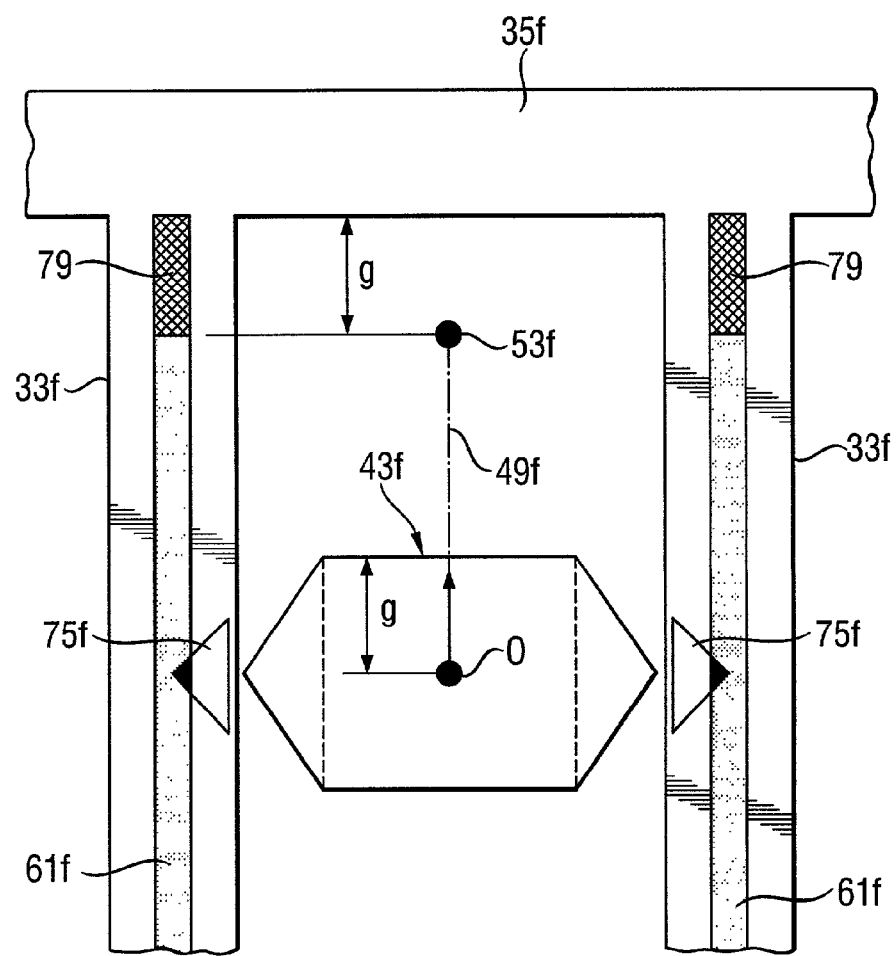
FIG. 12 shows a variant of the embodiment shown in FIG. 11 for detecting the path end.

Another embodiment of the invention, similar to that of FIG. 11, is shown in FIG. 12.

In addition to a projection beam 43f, there are provided two auxiliary positioning beams 75f, one being provided on each side of the projection beam 43f. While the projection beam 43f moves on the predetermined path 49f, the auxiliary positioning beams 75f move on mark strips 61f in order to position the beam center O on the predetermined path 49f through the interaction of the electrons of the auxiliary beam 75f with the mark regions 61f, as described above.

End marks 79 are provided on each end of the struts 33f adjacent to transverse struts 35f such that the auxiliary beams 75f impinge on said end marks as soon as the beam center O approaches the end point 53f. The end marks 79 are formed of a material, whose interaction with the electron beam differs from the interaction with the materials used to form the struts 33f, 35f, the membrane layer, the scattering regions and the mark layer 61f. However, this interaction is also detectable by the sensor or by a separate sensor (not shown) provided for this purpose, so that the reaching of the end position 53f can be detected in a similar way as in the embodiment illustrated in FIG. 11.

Figure 13:
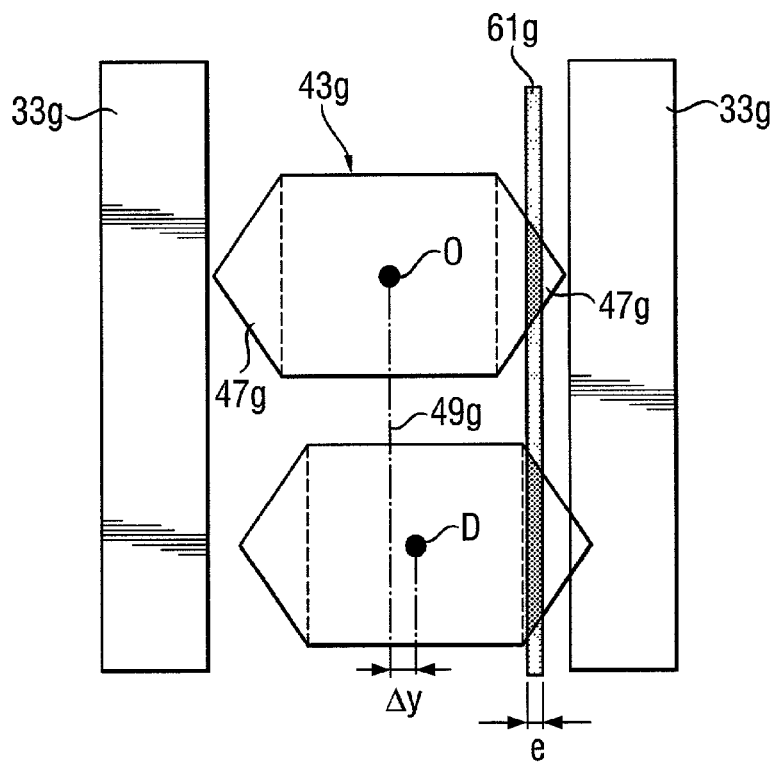
FIG. 13 shows a variant of the embodiment shown in FIG. 5.

FIG. 13 shows a variant of the embodiment shown in FIG. 5. Unlike the embodiment of FIG. 5, in the present embodiment a mark region 61g is not provided in projection on a strut 33g, but in the area between adjacent struts 33g such that a projection beam cross-section 43g which has its beam center O accurately positioned on a predetermined path 49g overlaps with the mark strip 61g with its portion tapering transversely to the direction into which the path 49g extends, i.e., with its triangular portion 47g. The area of overlap is dependent on a deviation Δy of the beam center O from the predetermined path 49g and increases, as is shown in FIG. 13 by the lower beam cross-section with beam center D, if it deviates to the right from the predetermined path. As the area of overlap changes, the number of interactions between the electrons of the beam with the material of the mark region 61g changes, which is detected by the sensor and used for the correction of the path of the beam cross-section.

As in this embodiment the mark region is provided between the struts, i.e., in a region which is used to form the pattern of the mask through scattering regions (reference number 39 in FIG. 4), care must be taken that the scattering of the electrons by the material of the mark regions 61g is so little that the imaging of the pattern onto the substrate is as far as possible not interfered with. However, there are still enough interactions which are detectable by the sensor in order to perform the correction of the beam guidance, as described above.

As a further embodiment of the invention, it is possible to use different materials for the two mark regions 61 shown in FIG. 5 which differ in respect of their interaction with the electron beams. As a result, it can be determined by a suitable sensor or a pair of sensors whether the beam center of the projection beam 43 deviates to the right or to the left from its predetermined path 49. Such a mask can be prepared in that the two materials are alternately used for the struts, i.e., every second strut is formed from the same material.

Another embodiment of the mask shown in FIG. 4 can be fabricated in that the mark material is added to the material used for the struts, for example, by doping or implanting. In this way, the struts themselves form the mark regions.

Figure 14:
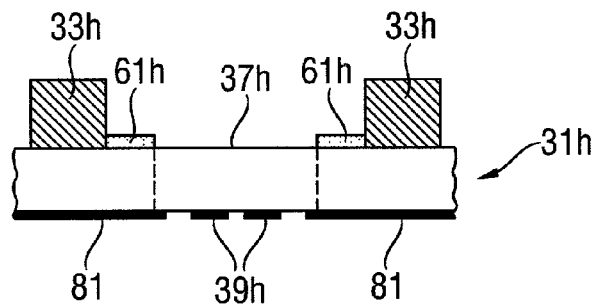
FIG. 14 shows a further variant of the mask shown in FIG. 4.

FIG. 14 shows another embodiment of the masks schematically shown in FIGS. 4, 7, 8 and 9. The mask 31h shown in FIG. 14 differs from the masks shown in the preceding Figures, one difference is that a mark region 61h, viewed in projection in beam direction, does not overlap with a strut 33h but is positioned beside the same on a membrane layer 37h.

For this purpose, the region between adjacent mark regions 61h may be used as a region which is imaged by the charged particles onto the layer to be exposed, i.e., a region whose inside width corresponds to or is less than the inside width between the mark regions 61h shown in FIG. 14.

This mask can be employed together with the projection beam cross-sections as they have been described above. In another embodiment, an adjustment between the mark regions 61h and the projection beam cross-section can be applied as it has been described in connection with FIG. 5. There, the projection beam cross-section has a width which corresponds to the inside width between the mark regions 61h. The beam is then guided such that the detector 65 of FIG. 4 detects a detection signal of substantially zero when the projection beam cross-section is positioned in its reference position with respect to the mask.

The adjustment between the projection beam cross-section and the mask of FIG. 14, however, can also be achieved in the way as described in respect of FIG. 6, where the projection beam cross-section comprises laterally positioned auxiliary beams, which serve to produce the signal for the detector 65, the beam then may be guided such that the measuring signal produced by the detector 65 is maintained constant at a predetermined value.

In another embodiment, the adjustment may also be such as it has been described in respect of FIG. 13, the projection beam cross-section impinging with its laterally tapered portions on the mark regions 61h and the beam being again guided such that the detection signal of the detector 65 is maintained constant at a predetermined value.

In another embodiment, different materials are used in each case for adjacent mark regions 61h of FIG. 14 in order to be able to detect a deviation of the beam guidance in the one and the other direction by means of detectors.

In another embodiment, the mask 31h of FIG. 14 may also comprise masking regions 81 which, viewed in projection parallel to the particle beam, overlap with the mark regions 61h. The masking areas 81, viewed in projection parallel to the particle beam, extend even beyond the mark regions 61h and also overlap with the struts 33h. The masking regions 81 may also serve to scatter charged particles which have not or only slightly been scattered by the mark regions 61h or the struts 33h to such an extent that they are not imaged onto the layer to be exposed, as has been described in respect of beam 13 in FIG. 1.

To this end, the same material may be used for the masking layer 81 as for the scattering regions 39h on the membrane 37h.

In another embodiment, the masking regions 81 and the scattering regions 39h can be formed in a common fabrication step, as has already been explained in respect of the scattering regions of the above-described embodiment.

In the masks described above in particular in connection with FIGS. 4, 7, 8, 9 and 14, the struts are each provided, relative to the membrane layer, on the side disposed towards the beam shaping direction. However, it is also possible to provide the struts, relative to the membrane layer, on the opposite side, i.e., on the side disposed away from the beam shaping direction.

Moreover, it is possible to provide the mark regions on the side disposed towards the beam shaping direction of the supporting strut or on the membrane layer itself. In this case, the mark layer is again positioned between the membrane layer and the supporting strut, as it has been described in particular in connection with FIG. 7, or the mark layer is positioned on the membrane layer on the side opposed to the supporting strut, as it has been described in particular in connection with FIG. 9.

Moreover, it is possible that the mark layer, viewed in projection parallel to the particle beam, overlaps with the base of the struts. In this case, the mark regions may extend over the entire width of the supporting strut, as it has been described in particular in connection with FIGS. 4 and 7, or the mark regions may have a width which is less than the width of the supporting struts, as it has been described in particular in respect of FIGS. 8 and 9.

Moreover, viewed in projection parallel to the particle beam, the mark regions may also be disposed besides the supporting strut and that spaced apart therefrom, as it has been described in particular in connection with FIG. 13, or directly adjacent thereto, as it has been described in connection with FIG. 14.

In the embodiments shown in FIGS. 4, 7, 8 and 9 the scattering regions are positioned on the side of the membrane layer facing towards the beam shaping device. In another embodiment, it is possible in these embodiments to dispose the scattering regions also on the side of the membrane layer facing away from the beam shaping device, as it has been described in connection with FIG. 14. In another variation, it is also possible in the embodiment of FIG. 14 to dispose the scattering regions on the side of the membrane layer facing towards the beam shaping means.

Moreover, it is also possible, depending on the concrete embodiment selected, to provide the scattering regions on the membrane layer on the same side as the struts or on the opposite side.

In most of the above-described embodiments the tips of the triangular portions are spaced apart from one another in the mask plane by a distance which corresponds to the inside width between adjacent struts. However, it is also readily possible to select a smaller distance between the tips, i.e., for the beam width.

Advantages of the invention may include one or more of the following:

To provide an apparatus that can guide a beam with sufficient accuracy;

To provide an apparatus that can direct the beam of charged particles for imaging a pattern onto a substrate;

To provide an apparatus that can improve prior art masks;

To provide a process that can be used to guide a beam with sufficient accuracy;

To provide a process that can be used to direct the beam of charged particles for imaging a pattern onto a substrate; and To provide a process that can be used to improve prior art masks.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A projection apparatus for imaging a pattern of a mask onto a substrate having a radiation sensitive layer by using a beam of charged particles, the mask comprising a membrane layer made of a first material, scattering regions forming the pattern and made of a second material scattering the charged particles more than the membrane layer, a plurality of straightly extending supporting struts spaced apart from one another and supporting the membrane layer together with the scattering regions, and at least one mark region, wherein the projection apparatus comprises:

a beam shaping device for producing the beam of charged particles with a predetermined cross-section in a plane in which the mask extends;

a deflector for scanning the cross-section of the beam of charged particles in the plane in which the mask extends along a predetermined path over the mask parallel to the direction into which the struts extend;

a sensor for detecting, concurrently with the imaging of the pattern of the mask onto the substrate, a number of the charged particles impinging on the at least one mark region provided on the mask; and a controller responsive to a measuring signal dependent on the number of charged particles detected by the sensor and configured to control the deflector so as to reduce deviations from the predetermined path.

2. The projection apparatus according to claim 1, wherein the cross-section of the beam of charged particles has a width transverse to the direction into which the struts extend, wherein the width corresponds substantially to an inside width between adjacent struts.

3. The projection apparatus according to claim 2, wherein the beam shaping device furthermore produces at least one auxiliary positioning beam to interact with the mark region provided on the mask, wherein a cross-section of the auxiliary beam is positioned in the mask plane at a predetermined constant distance relative to the cross-section of the beam of charged particles.

4. The projection apparatus according to claim 1, wherein the controller is configured to control the predetermined path of the cross-section of the beam of charged particles such that the number of charged particles impinging on the at least one mark region is minimized.

5. The projection apparatus according to claim 1, wherein the controller is configured to control the predetermined path of the cross-section of the beam of charged particles such that the number of charged particles impinging on the at least one mark region corresponds to a predetermined value.

6. The projection apparatus according to claim 1, wherein the controller is responsive to the measuring signal to stop a movement of the cross-section of the beam of charged particles along the predetermined path.

7. The projection apparatus according to claim 1, wherein the cross-section of the beam of charged particles has a width transverse to the direction into which the struts extend, which corresponds substantially to the inside width between adjacent struts.

8. The projection apparatus according to claim 1, wherein the sensor comprises at least one of an Auger electron detector, a backscattering electron detector, an X-ray detector, and a fluorescence radiation detector.

9. A projection apparatus for imaging a pattern of a mask onto a substrate having a radiation sensitive layer by using a beam of charged particles, the mask comprising a membrane layer made of a first material, scattering regions forming the pattern and made of a second material scattering the charged particles more than the membrane layer, a plurality of straightly extending supporting struts spaced apart from one another and supporting the membrane layer together with the scattering regions, and at least one mark region, wherein the projection apparatus comprises:

a beam shaping device for producing the beam of charged particles with a predetermined cross-section in a plane in which the mask extends;

a deflector for scanning the cross-section of the beam of charged particles in the plane in which the mask extends along a predetermined path over the mask parallel to the direction into which the struts extend; and a sensor for detecting, concurrently with the imaging of the pattern of the mask onto the substrate, a number of the charged particles impinging on the at least one mark region provided on the mask; wherein the deflector is responsive to a measuring signal dependent on the number of charged particles detected by the sensor in order to reduce deviations from the predetermined path; and wherein the beam shaping device further produces at least one auxiliary positioning beam to interact with the at least one mark region provided on the mask, wherein a cross-section of the at least one auxiliary beam is positioned in the plane in which the mask extends at a predetermined constant distance relative to the cross-section of the beam of charged particles.

10. The projection apparatus according to claim 9, wherein the cross-section of the auxiliary positioning beam continuously tapers into a direction transverse to a direction into which the predetermined path of the cross-section of the beam of charged particles extends.

11. The projection apparatus according to claim 10, wherein the beam shaping device produces two auxiliary positioning beams, whose auxiliary beam cross-sections are spaced apart from one another in the mask plane transverse to the direction into which the struts extend by an inside distance which is larger than the inside width between adjacent struts.

12. The projection apparatus according to claim 9, wherein the beam shaping device produces a first auxiliary positioning beam and a second auxiliary positioning beam, wherein the cross-section of the first auxiliary positioning beam is spaced apart from the cross-section of the second auxiliary positioning beam in the plane in which the mask extends transverse to the direction into which the struts extend by an inside distance which is larger than an inside width between adjacent struts.

13. A projection apparatus for imaging a pattern of a mask onto a substrate having a radiation sensitive layer by using a beam of charged particles, the mask comprising a membrane layer made of a first material, scattering regions forming the pattern and made of a second material scattering the charged particles more than the membrane layer, a plurality of straightly extending supporting struts spaced apart from one another and supporting the membrane layer together with the scattering regions, and at least one mark region, wherein the projection apparatus comprises:

a beam shaping device for producing the beam of charged particles with a predetermined cross-section in a plane in which the mask extends;

a deflector for scanning the cross-section of the beam of charged particles in the plane in which the mask extends along a predetermined path over the mask parallel to the direction into which the struts extend; and a sensor for detecting, concurrently with the imaging of the pattern of the mask onto the substrate, a number of the charged particles impinging on the at least one mark region provided on the mask; wherein the deflector is responsive to a measuring signal dependent on the number of charged particles detected by the sensor in order to reduce deviation from the predetermined path; and wherein the beam shaping device furthermore produces at least one auxiliary positioning beam to interact with the mark region provided on the mask, wherein a cross-section of the auxiliary beam is positioned in the mask plane at a predetermined constant distance relative to the cross-section of the beam of charged particles.

14. A method for exposing a radiation sensitive layer, the method comprising:

generating a shaped beam of charged particles having a predetermined cross-section in a plane of a mask providing a pattern to be imaged onto a radiation sensitive layer using the beam of charged particles;

scanning the beam of charged particles across the mask along a predetermined path;

detecting radiation generated by a number of the charged particles incident on at least one mark region provided on the mask, wherein the detecting of the radiation is performed concurrently with the exposing of the radiation sensitive layer; and controlling the scanning of the beam of charged particles based on the detected radiation.

15. The method according to claim 14, wherein the at least one mark region is an elongated mark region extending parallel to a supporting strut of the mask.

16. The method according to claim 14, wherein the scanning of the beam of charged particles is controlled such that a deviation between a line along which the cross-section of the beam of charged particles is scanned in the plane of the mask and a predetermined line is minimized.

17. The method according to claim 14, wherein the controlling of the scanning of the beam of charged particles comprises stopping the scanning along a predetermined line based on the detected radiation.

* * * * *